(12) United States Patent
Amblard et al.

(10) Patent No.: US 7,704,674 B1
(45) Date of Patent: Apr. 27, 2010

(54) METHOD FOR PATTERNING A PHOTO-RESIST IN AN IMMERSION LITHOGRAPHY PROCESS

(76) Inventors: Gilles Amblard, 5838 Chambertin Dr., San Jose, CA (US) 95118; Rohit R. Rosario, 492 Sierra Vista Ave., Mountain View, CA (US) 94043

( * ) Notice: Subject to any disclaimer, the term of this patent is extended or adjusted under 35 U.S.C. 154(b) by 0 days.

(21) Appl. No.: 12/347,786

(22) Filed: Dec. 31, 2008

(51) Int. Cl.
G03F 7/00 (2006.01)
G03F 7/004 (2006.01)

(52) U.S. Cl. .............. 430/270.1; 430/273.1; 430/311; 430/330

(58) Field of Classification Search .......... 430/270.1, 430/273.1, 311
See application file for complete search history.

(56) References Cited

U.S. PATENT DOCUMENTS

| | | | |
|---|---|---|---|
| 7,316,886 B2* | 1/2008 | Kanda | 430/270.1 |
| 7,354,693 B2* | 4/2008 | Hatakeyama et al. | 430/270.1 |
| 7,473,512 B2* | 1/2009 | Houlihan et al. | 430/273.1 |
| 2005/0202351 A1* | 9/2005 | Houlihan et al. | 430/322 |
| 2006/0105272 A1* | 5/2006 | Gallagher et al. | 430/311 |
| 2007/0111541 A1* | 5/2007 | Endo et al. | 438/780 |
| 2007/0160930 A1* | 7/2007 | Wang et al. | 430/270.1 |

FOREIGN PATENT DOCUMENTS

JP        2007140228 A   *   6/2007

OTHER PUBLICATIONS

Sanrame, Carlos N., "Direct photobleaching of acrylates in polymethylsilsesquioxane films by 193 nm irradiation," Elsevier Ltd., ScienceDirect, Polymer 49 (2008), pp. 412-421.

* cited by examiner

*Primary Examiner*—Amanda C. Walke
(74) *Attorney, Agent, or Firm*—Blakely, Sokoloff, Taylor & Zafman LLP

(57) ABSTRACT

A method for patterning a photo-resist in an immersion lithography process is described. The method includes forming a photo-resist layer above a substrate. A hydrophobic and contrast-enhancing barrier layer is formed above the photo-resist layer. The photo-resist layer is exposed, through the hydrophobic and contrast-enhancing barrier layer, to a light source. The photo-resist layer is developed to provide a patterned photo-resist layer.

18 Claims, 4 Drawing Sheets

METHOD FOR PATTERNING A PHOTO-RESIST IN AN IMMERSION LITHOGRAPHY PROCESS

TECHNICAL FIELD

Embodiments of the invention are in the field of immersion lithography and, in particular, methods for patterning photo-resists in immersion lithography processes.

BACKGROUND

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity.

Scaling has not been without consequence, however. As the dimensions of the fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

Immersion lithography has been introduced as a technique to handle such issues. In immersion lithography, a liquid film is placed between a lens and a photo-resist layer in order to increase the index of refraction for the light-path from the lens to the photo-resist layer. The increased index of refraction of the liquid, versus e.g. air, enables the formation of smaller dimensions and a tighter pitch for a developed photo-resist. However, additional improvements are needed in the evolution of immersion lithography technology.

DETAILED DESCRIPTION

A method for patterning a photo-resist in an immersion lithography process is described herein. In the following description, numerous specific details are set forth, such as specific dimensions, in order to provide a thorough understanding of embodiments of the present invention. It will be apparent to one skilled in the art that embodiments of the present invention may be practiced without these specific details. In other instances, well-known processing operations, such as wet cleans operations, are not described in detail in order to not unnecessarily obscure embodiments of the present invention. Furthermore, it is to be understood that the various embodiments shown in the Figures are illustrative representations and are not necessarily drawn to scale.

Disclosed herein are methods for patterning photo-resists in immersion lithography processes. In an embodiment, a method includes forming a photo-resist layer above a substrate. A hydrophobic and contrast-enhancing barrier layer is then formed above the photo-resist layer. The photo-resist layer is then exposed, through the hydrophobic and contrast-enhancing barrier layer, to a light source. The photo-resist layer is subsequently developed to provide a patterned photo-resist layer. In another embodiment, a method includes forming a photo-resist layer above a substrate, the photo-resist layer including a set of barrier-forming components. The photo-resist layer is then heated. The spin-coating or the heating causes the set of barrier-forming components to migrate from the bulk of the photo-resist layer to form a hydrophobic and contrast-enhancing barrier layer at the top surface of the photo-resist layer. The photo-resist layer is then exposed, through the hydrophobic and contrast-enhancing barrier layer, to a light source. The photo-resist layer is subsequently developed to provide a patterned photo-resist layer.

A barrier layer may be used between an immersion liquid film and a photo-resist layer in an immersion lithography process. In accordance with an embodiment of the present invention, a hydrophobic and contrast-enhancing barrier layer is used between an immersion liquid film and a photo-resist layer in an immersion lithography process during an exposure operation. In an embodiment, the inclusion of a hydrophobic and contrast-enhancing barrier layer on an exposed lithographic stack reduces or eliminates immersion-related defects and enhances the contrast of an aerial image in an exposed photo-resist layer. In one embodiment, a hydrophobic and contrast-enhancing barrier layer is included in an exposed stack by depositing the barrier layer above a photo-resist layer prior to lithographic exposure. In another embodiment, a hydrophobic and contrast-enhancing barrier layer is included in an exposed stack by migration of a set of barrier-forming components from the bulk of a photo-resist layer to the top surface of the photo-resist layer prior to lithographic exposure.

Figure 1:
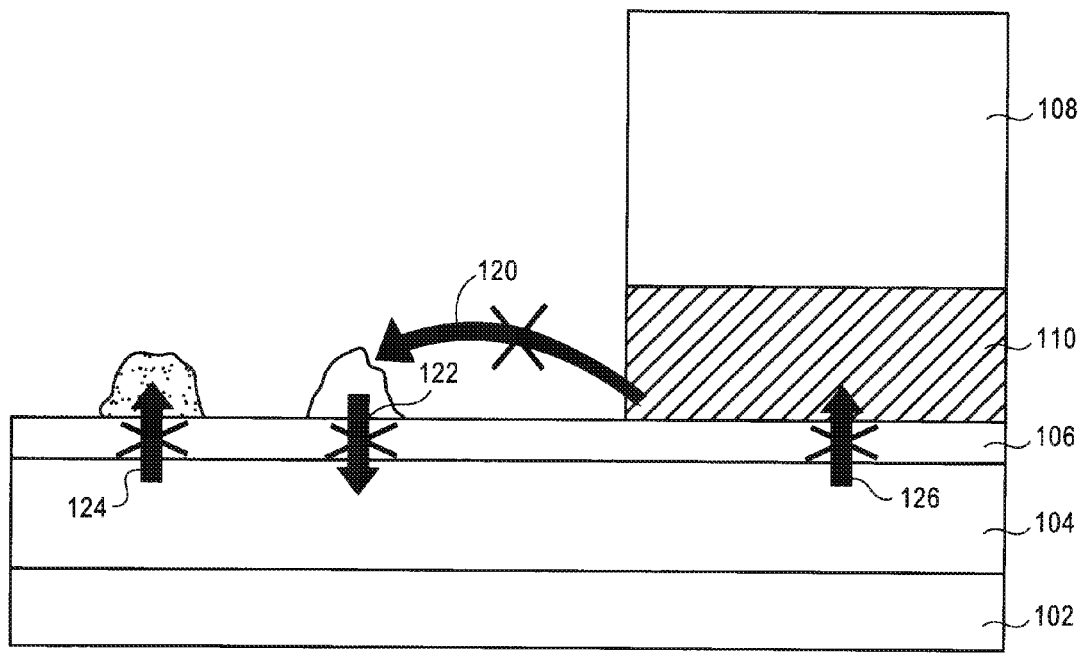
FIG. 1 illustrates a cross-sectional view of a lithographic stack, including a hydrophobic and contrast-enhancing barrier layer coupled with a lens and an immersion liquid film, in accordance with an embodiment of the present invention.

The inclusion of a hydrophobic and contrast-enhancing barrier layer on an exposed lithographic stack may reduce or eliminate immersion-related defects. FIG. 1 illustrates a cross-sectional view of a lithographic stack, including a hydrophobic and contrast-enhancing barrier layer coupled with a lens and an immersion liquid film, in accordance with an embodiment of the present invention.

Referring to FIG. 1, a lithographic stack includes a photo-resist layer 104 disposed above a substrate 102. The substrate may include an active layer, such as a semiconductor device layer, or a dielectric layer, such as a hard-mask layer, for patterning subsequent to the formation of a pattern in photo-resist layer 104. A hydrophobic and contrast-enhancing barrier layer 106 is disposed above photo-resist layer 104. In one embodiment, an immersion lithographic process is performed by scanning a lens 108 from a lithographic exposure tool, relative to substrate 102, above and across the top surface of hydrophobic and contrast-enhancing barrier layer 106. An immersion liquid 110 is disposed directly between lens 108 and hydrophobic and contrast-enhancing barrier layer 106, as depicted in FIG. 1. In accordance with an embodiment of the present invention, hydrophobic and contrast-enhancing barrier layer 106 prevents or substantially prevents the formation of immersion liquid-droplets 120 in areas to be scanned or already scanned. In another embodiment, hydrophobic and contrast-enhancing barrier layer 106 prevents or substantially prevents immersion liquid penetration 122 into photo-resist layer 104. In another embodiment, hydrophobic and contrast-enhancing barrier layer 106 prevents or substantially prevents, prior to or subsequent to contact with immersion liquid 110, leaching of resist components 124 from photo-resist layer 104 to the top surface of hydrophobic and contrast-enhancing barrier layer 106. In yet another embodiment, hydrophobic and contrast-enhancing barrier layer 106 prevents or substantially prevents, during contact with immersion liquid 110, leaching of resist components 126 from photo-resist layer 104 to the top surface of hydrophobic and contrast-enhancing barrier layer 106, e.g. into immersion liquid 110.

The inclusion of a hydrophobic and contrast-enhancing barrier layer on an exposed lithographic stack may enhance, through a bleaching process, the contrast of an aerial image in an exposed photo-resist layer. FIGS. 2A-2D illustrate a series of cross-sectional views of a lithographic stack including a hydrophobic and contrast-enhancing barrier layer, in accordance with an embodiment of the present invention.

Figure 2A:
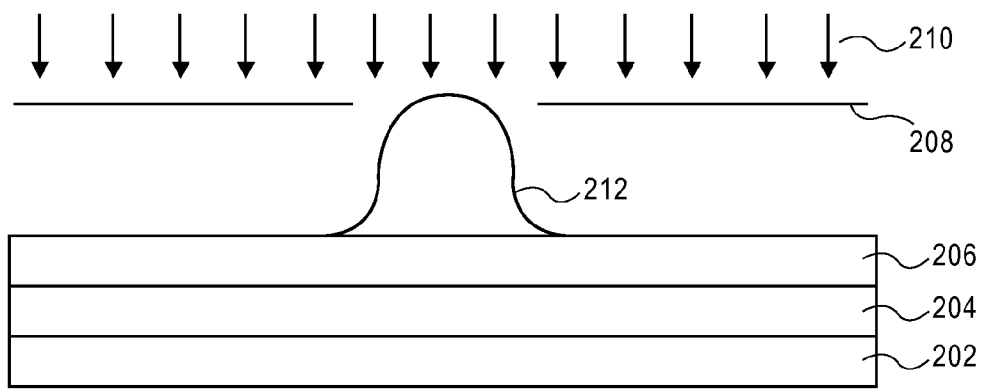
FIGS. 2A-2D illustrate a series of cross-sectional views of a lithographic stack including a hydrophobic and contrast-enhancing barrier layer, in accordance with an embodiment of the present invention.
Figure 2B:
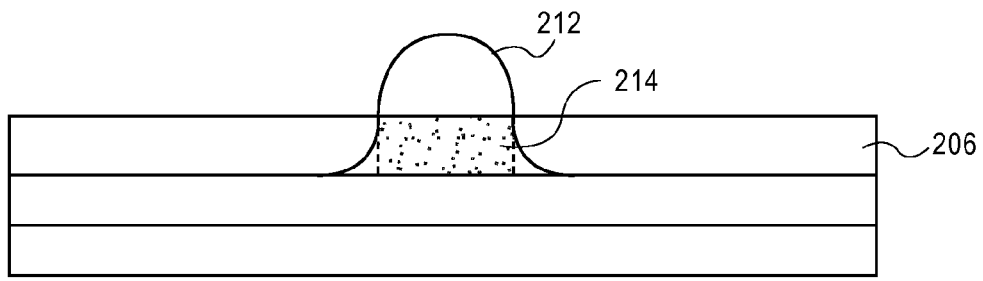
Figure 2C:
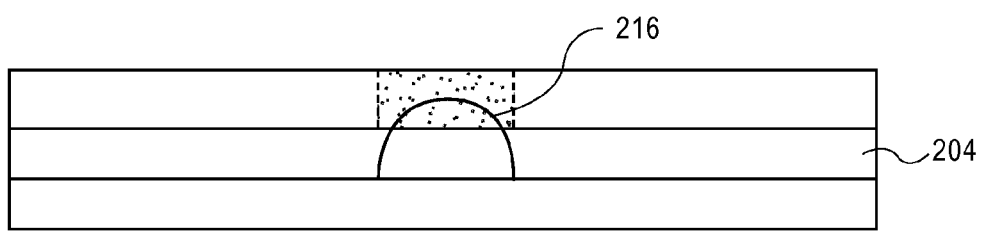
Figure 2D:
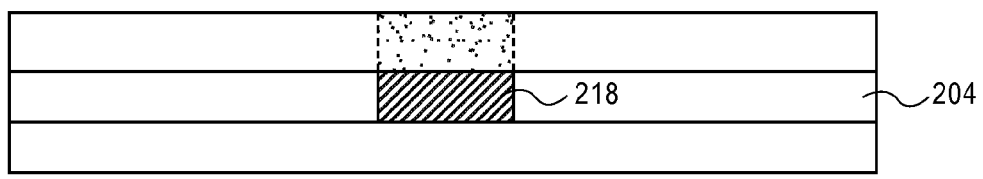

Referring to FIG. 2A, through a mask 208, a scanner exposure 210 is performed on a photo-resist layer 204 capped with a hydrophobic and contrast-enhancing barrier layer 206. Photo-resist layer 204 and hydrophobic and contrast-enhancing barrier layer 206 are disposed above a substrate or patterning layer 202. An aerial image 212 is generated with a degraded contrast, as depicted in FIG. 2A. Referring to FIG. 2B, an exposure light bleaches a portion 214 of hydrophobic and contrast-enhancing barrier layer 206. The bleaching is a threshold bleaching which only reacts to a portion of aerial image 212, increasing the contrast of the image. Referring to FIG. 2C, through bleached portion 214 of hydrophobic and contrast-enhancing barrier layer 206, contrast-enhanced aerial image 216 is transferred to photo-resist layer 204. Finally, referring to FIG. 2D and in accordance with an embodiment of the present invention, a feature 218 with improved contrast is formed in photo-resist layer 204.

Figure 3:
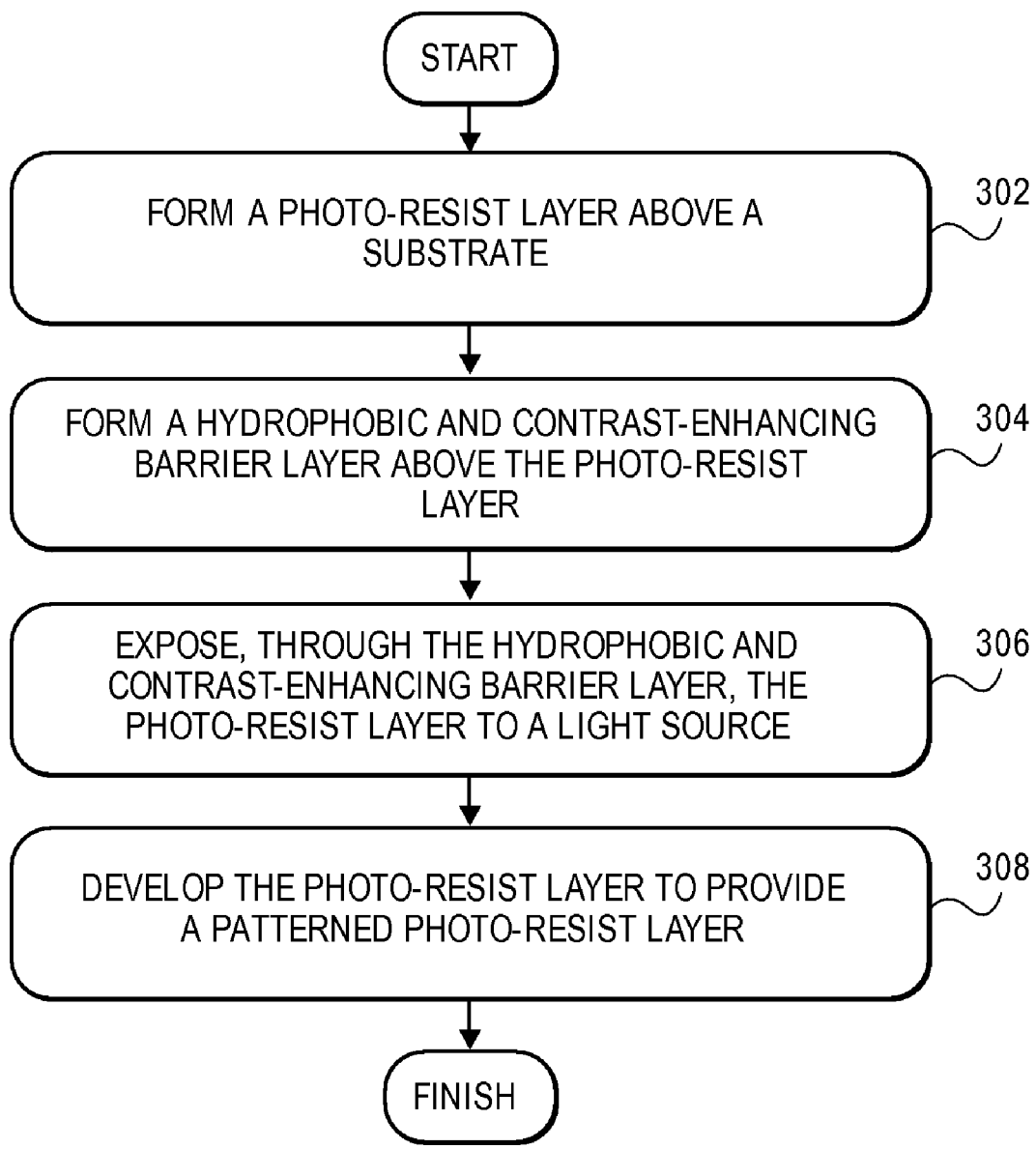
FIG. 3 illustrates a Flowchart representing operations in a method for patterning a photo-resist in an immersion lithography process, in accordance with an embodiment of the present invention.

A hydrophobic and contrast-enhancing barrier layer may be included in an exposed stack by depositing the barrier layer above a photo-resist layer prior to lithographic exposure. FIG. 3 illustrates a Flowchart 300 representing operations in a method for patterning a photo-resist in an immersion lithography process, in accordance with an embodiment of the present invention.

Referring to operation 302 of Flowchart 300, a photo-resist layer is formed above a substrate. The substrate may be composed of a material suitable to withstand a manufacturing process and upon which material films may suitably be disposed. In an embodiment, the substrate is composed of group IV-based materials such as, but not limited to, crystalline silicon, germanium or silicon/germanium. In another embodiment, the substrate is composed of a III-V material. The substrate may also include an insulating layer. In one embodiment, the insulating layer is composed of a material such as, but not limited to, silicon nitride, silicon oxy-nitride or a high-k dielectric layer. In an alternative embodiment, the substrate is composed of a flexible plastic sheet. In accordance with an embodiment of the present invention, the substrate has disposed thereon for patterning an active layer, such as a semiconductor device layer, or a dielectric layer, such as a hard-mask layer. The photo-resist layer may be composed of a material suitable for use in a lithographic process. That is, in one embodiment, a patterned photo-resist layer is formed upon exposure of the photo-resist layer to a light source, and subsequent development of the exposed photo-resist layer. In an embodiment, the photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra-violet (EUV) resist or a phenolic resin matrix with a diazonaphthoquinone sensitizer. In another embodiment, the photo-resist layer is composed of a negative photo-resist material. In a specific embodiment, the photo-resist layer is composed of a negative photo-resist material such as, but not limited to, poly-cis-isoprene or poly-vinyl-cinnamate. In an embodiment, the photo-resist layer is formed on the substrate in by a spin-on process and is subsequently baked prior to the formation of a hydrophobic and contrast-enhancing barrier layer described below in association with operation 304.

Referring to operation 304 of Flowchart 300, a hydrophobic and contrast-enhancing barrier layer is formed above the photo-resist layer. In accordance with an embodiment of the present invention, the hydrophobic and contrast-enhancing barrier layer is formed above the photo-resist layer by a spin-on technique. In one embodiment, forming the hydrophobic and contrast-enhancing barrier layer above the photo-resist layer includes forming a layer composed of a fluoro-carbon and an acrylate chromophore. In a specific embodiment, forming the layer composed of the fluoro-carbon and the acrylate chromophore includes forming a layer composed of a fluoro-carbon acrylate and trimethylolpropane propoxylate triacrylate chromophore. In a particular embodiment, forming the layer composed of the fluoro-carbon acrylate and the trimethylolpropane propoxylate triacrylate chromophore includes forming a layer composed of a fluoro-methyl-acrylate and the trimethylolpropane propoxylate triacrylate chromophore. In another embodiment, forming the hydrophobic and contrast-enhancing barrier layer includes forming the layer to a thickness approximately in the range of 5-200 nanometers. In an embodiment, prior to exposing the photo-resist layer to the light source as described below in association with operation 306, the hydrophobic and contrast-enhancing barrier layer is heated to a temperature approximately in the range of 80-160 degrees Celsius for a duration approximately in the range of 30-120 seconds.

Referring to operation 306 of Flowchart 300, through the hydrophobic and contrast-enhancing barrier layer, the photo-resist layer is exposed to a light source. In accordance with an embodiment of the present invention, the photo-resist layer is exposed to the light source in an immersion lithography process. For example, in an embodiment, an immersion liquid, such as high purity water, is disposed directly between a lens of a lithographic exposure tool and the hydrophobic and contrast-enhancing barrier layer during the exposure to a wavelength of light, e.g. 193 nanometer light. In one embodiment, the hydrophobic and contrast-enhancing barrier layer substantially prevents leaching of components of the photo-resist layer to the top surface of the hydrophobic and contrast-enhancing barrier layer. In one embodiment, the hydrophobic and contrast-enhancing barrier layer substantially prevents immersion liquid penetration from the top surface of the hydrophobic and contrast-enhancing barrier layer to the photo-resist layer. In an embodiment, the hydrophobic and contrast-enhancing barrier layer enhances a serial image contrast within the photo-resist layer. In accordance with an embodiment of the present invention, subsequent to the exposure and prior to developing the photo-resist layer as described below in association with operation 308, the photo-resist layer is baked at a temperature approximately in the range of 80-160 degrees Celsius for a duration approximately in the range of 30-120 seconds.

Referring to operation 308 of Flowchart 300, the photo-resist layer is developed to provide a patterned photo-resist layer. In accordance with an embodiment of the present invention, the photo-resist layer is developed using a wet chemical developer such as, but not limited to, tetramethyl-ammonium hydroxide (TMAH) solution. In an embodiment, the hydrophobic and contrast-enhancing barrier layer is removed during the developing of the photo-resist layer to provide the patterned photo-resist layer. Accordingly, in that embodiment, developing the photo-resist layer to provide the patterned photo-resist layer includes removing the hydrophobic and contrast-enhancing barrier layer. In an alternative embodiment, the hydrophobic and contrast-enhancing barrier layer is removed, in a separate operation, prior to developing the photo-resist layer.

Figure 4:
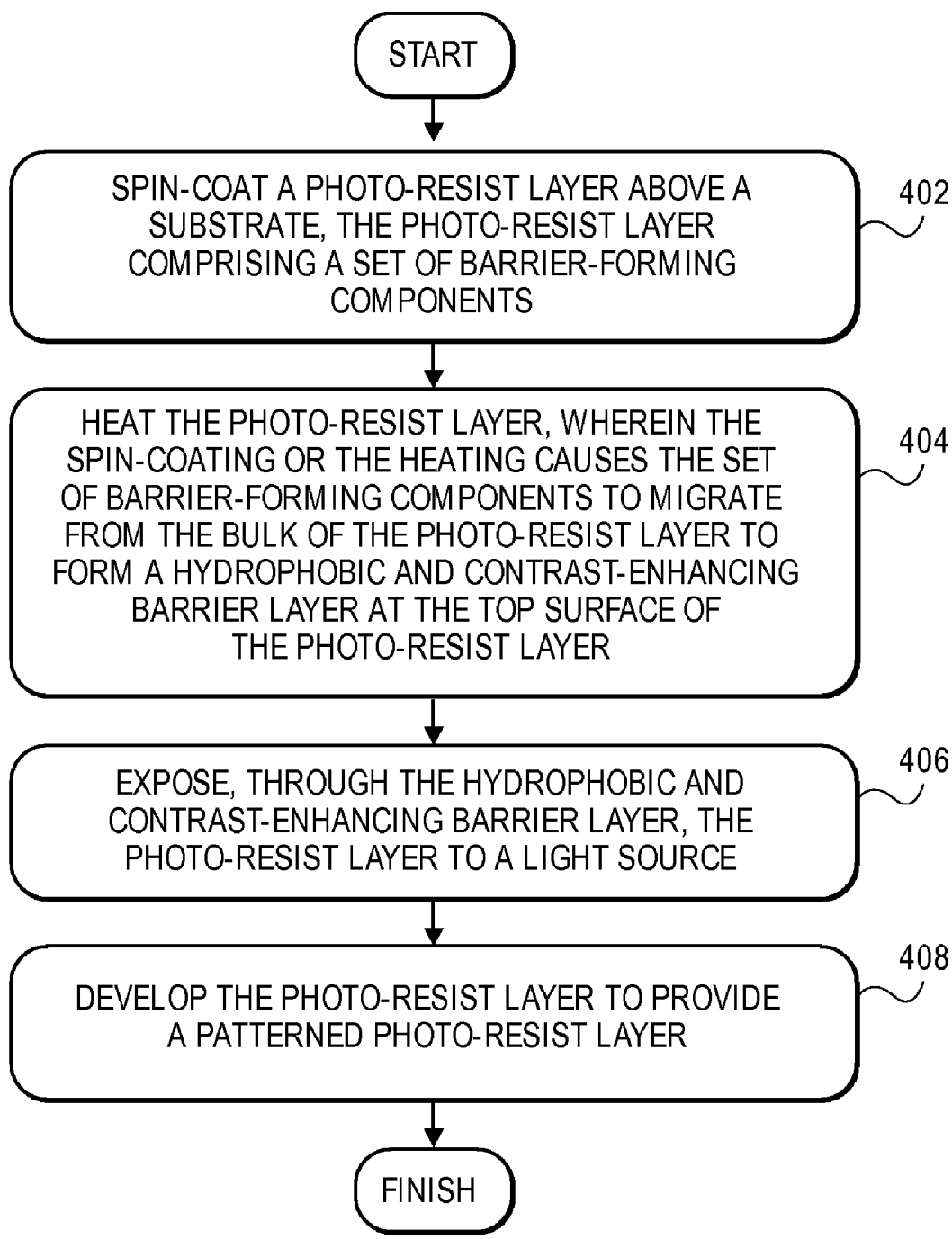
FIG. 4 illustrates a Flowchart representing operations in a method for patterning a photo-resist in an immersion lithography process, in accordance with an embodiment of the present invention.

A hydrophobic and contrast-enhancing barrier layer may be included in an exposed stack by migration of a set of barrier-forming components from the bulk of a photo-resist layer to the top surface of the photo-resist layer prior to lithographic exposure. FIG. 4 illustrates a Flowchart 400 representing operations in a method for patterning a photo-resist in an immersion lithography process, in accordance with an embodiment of the present invention.

Referring to operation 402 of Flowchart 400, a photo-resist layer is spin-coated above a substrate, the photo-resist layer including a set of barrier-forming components. The substrate and photo-resist layer may be composed of materials such as those described above in association with the substrate and photo-resist layer of operation 302. In accordance with an embodiment of the present invention, the photo-resist layer as formed further includes a set of barrier-forming components. In one embodiment, spin-coating the photo-resist layer above the substrate includes forming the photo-resist layer to be composed of approximately 30% or less, by volume, of the set of barrier-forming components. In a specific embodiment, spin-coating the photo-resist layer above the substrate, the photo-resist layer including the set of barrier-forming components, includes forming the photo-resist layer to a thickness approximately in the range of 20-500 nanometers. In accordance with an embodiment of the present invention, the set of components included in the formed photo-resist layer are similar or the same as those described below in operation 404, in association with the composition of the hydrophobic and contrast-enhancing barrier layer.

Referring to operation 404 of Flowchart 400, the photo-resist layer is heated. The spin-coating of operation 402 or the heating of operation 404 causes the set of barrier-forming components to migrate from the bulk of the photo-resist layer to form a hydrophobic and contrast-enhancing barrier layer at the top surface of the photo-resist layer. In accordance with an embodiment of the present invention, heating the photo-resist layer includes heating to a temperature approximately in the range of 80-160 degrees Celsius for a duration approximately in the range of 30-120 seconds. In one embodiment, forming the hydrophobic and contrast-enhancing barrier layer above the photo-resist layer includes forming a layer composed of a fluoro-carbon and an acrylate chromophore. In a specific embodiment, forming the layer composed of the fluoro-carbon and the acrylate chromophore includes forming a layer composed of a fluoro-carbon acrylate and trimethylolpropane propoxylate triacrylate chromophore. In a particular embodiment, forming the layer composed of the fluoro-carbon acrylate and the trimethylolpropane propoxylate triacrylate chromophore includes forming a layer composed of a fluoro-methyl-acrylate and the trimethylolpropane propoxylate triacrylate chromophore. In an embodiment, forming the hydrophobic and contrast-enhancing barrier layer includes forming the layer to a thickness approximately in the range of 5-200 nanometers.

Referring to operation 406 of Flowchart 400, through the hydrophobic and contrast-enhancing barrier layer, the photo-resist layer is exposed to a light source. In accordance with an embodiment of the present invention, the photo-resist layer is exposed to the light source in an immersion lithography process. For example, in an embodiment, an immersion liquid, such as high purity water, is disposed directly between a lens of a lithographic exposure tool and the hydrophobic and contrast-enhancing barrier layer during the exposure to a wavelength of light, e.g. 193 nanometer light. In one embodiment, the hydrophobic and contrast-enhancing barrier layer substantially prevents leaching of components of the photo-resist layer to the top surface of the hydrophobic and contrast-enhancing barrier layer. In one embodiment, the hydrophobic and contrast-enhancing barrier layer substantially prevents immersion liquid penetration from the top surface of the hydrophobic and contrast-enhancing barrier layer to the photo-resist layer. In an embodiment, the hydrophobic and contrast-enhancing barrier layer enhances a serial image contrast within the photo-resist layer. In accordance with an embodiment of the present invention, subsequent to the exposure and prior to developing the photo-resist layer as described below in association with operation 408, the photo-resist layer is baked at a temperature approximately in the range of 80-160 degrees Celsius for a duration approximately in the range of 30-120 seconds.

Referring to operation 408 of Flowchart 400, the photo-resist layer is developed to provide a patterned photo-resist layer. In accordance with an embodiment of the present invention, the photo-resist layer is developed using a wet chemical developer such as, but not limited to, TMAH solution. In an embodiment, the hydrophobic and contrast-enhancing barrier layer is removed during the developing of the photo-resist layer to provide the patterned photo-resist layer. Accordingly, in that embodiment, developing the photo-resist layer to provide the patterned photo-resist layer includes removing the hydrophobic and contrast-enhancing barrier layer. In an alternative embodiment, the hydrophobic and contrast-enhancing barrier layer is removed, in a separate operation, prior to developing the photo-resist layer.

Thus, methods for patterning photo-resists in immersion lithography processes have been disclosed. In accordance with an embodiment of the present invention, the method includes forming a photo-resist layer above a substrate. A hydrophobic and contrast-enhancing barrier layer is then formed above the photo-resist layer. The photo-resist layer is then exposed, through the hydrophobic and contrast-enhancing barrier layer, to a light source. The photo-resist layer is subsequently developed to provide a patterned photo-resist layer. In one embodiment, the hydrophobic and contrast-enhancing barrier layer is removed prior to developing the photo-resist layer. In another embodiment, the hydrophobic and contrast-enhancing barrier layer is removed during the developing of the photo-resist layer to provide the patterned photo-resist layer.

What is claimed is:
1. A method for patterning a photo-resist in an immersion lithography process, the method comprising:
    forming a photo-resist layer above a substrate;
    forming a hydrophobic and contrast-enhancing barrier layer above the photo-resist layer;

exposing, through the hydrophobic and contrast-enhancing barrier layer, the photo-resist layer to a light source;
removing the hydrophobic and contrast-enhancing barrier layer; and, subsequently, developing the photo-resist layer to provide a patterned photo-resist layer.

2. The method of claim 1, wherein forming the hydrophobic and contrast-enhancing barrier layer above the photo-resist layer comprises forming a layer comprising a fluoro-carbon and an acrylate chromophore.

3. The method of claim 2, wherein forming the layer comprising the fluoro-carbon and the acrylate chromophore comprises forming a layer comprising a fluoro-carbon acrylate and trimethylolpropane propoxylate triacrylate chromophore.

4. The method of claim 1, further comprising:
prior to exposing the photo-resist layer to the light source, heating the hydrophobic and contrast-enhancing barrier layer to a temperature approximately in the range of 80-160 degrees Celsius for a duration approximately in the range of 30-120 seconds.

5. The method of claim 1, wherein forming the hydrophobic and contrast-enhancing barrier layer comprises forming the layer to a thickness approximately in the range of 5-200 nanometers.

6. The method of claim 1, wherein the hydrophobic and contrast-enhancing barrier layer substantially prevents leaching of components of the photo-resist layer to the top surface of the hydrophobic and contrast-enhancing barrier layer and substantially prevents immersion liquid penetration from the top surface of the hydrophobic and contrast-enhancing barrier layer to the photo-resist layer.

7. The method of claim 1, wherein the hydrophobic and contrast-enhancing barrier layer enhances a serial image contrast within the photo-resist layer.

8. A method for patterning a photo-resist in an immersion lithography process, the method comprising:
spin-coating a photo-resist layer above a substrate, the photo-resist layer comprising a set of barrier-forming components;
heating the photo-resist layer, wherein the spin-coating or the heating causes the set of barrier-forming components to migrate from the bulk of the photo-resist layer to form a hydrophobic and contrast-enhancing barrier layer at the top surface of the photo-resist layer;
exposing, through the hydrophobic and contrast-enhancing barrier layer, the photo-resist layer to a light source; and
developing the photo-resist layer to provide a patterned photo-resist layer.

9. The method of claim 8, wherein developing the photo-resist layer to provide the patterned photo-resist layer comprises removing the hydrophobic and contrast-enhancing barrier layer.

10. The method of claim 8, further comprising:
removing the hydrophobic and contrast-enhancing barrier layer prior to developing the photo-resist layer.

11. The method of claim 8, wherein forming the hydrophobic and contrast-enhancing barrier layer above the photo-resist layer comprises forming a layer comprising a fluoro-carbon and an acrylate chromophore.

12. The method of claim 11, wherein forming the layer comprising the fluorocarbon and the acrylate chromophore comprises forming a layer comprising a fluorocarbon acrylate and trimethylolpropane propoxylate triacrylate chromophore.

13. The method of claim 8, wherein heating the photo-resist layer comprises heating to a temperature approximately in the range of 80-160 degrees Celsius for a duration approximately in the range of 30-120 seconds.

14. The method of claim 8, wherein forming the hydrophobic and contrast-enhancing barrier layer comprises forming the layer to a thickness approximately in the range of 5-200 nanometers.

15. The method of claim 8, wherein the hydrophobic and contrast-enhancing barrier layer substantially prevents leaching of components of the photo-resist layer to the top surface of the hydrophobic and contrast-enhancing barrier layer and substantially prevents immersion liquid penetration from the top surface of the hydrophobic and contrast-enhancing barrier layer to the photo-resist layer.

16. The method of claim 8, wherein the hydrophobic and contrast-enhancing barrier layer enhances a serial image contrast within the photo-resist layer.

17. The method of claim 8, wherein spin-coating the photo-resist layer above the substrate comprises forming the photo-resist layer to comprise approximately 30% or less by volume of the set of barrier-forming components.

18. The method of claim 8, wherein spin-coating the photo-resist layer above the substrate, the photo-resist layer comprising the set of barrier-forming components, comprises forming the photo-resist layer to a thickness approximately in the range of 20-500 nanometers.

* * * * *